(12) United States Patent
Mellati et al.

(10) Patent No.: US 12,431,911 B1
(45) Date of Patent: Sep. 30, 2025

(54) TIME-INTERLEAVED CURRENT-BASED DIGITAL-TO-ANALOG CONVERTER (CURRENT DAC)

(71) Applicant: Marvell Asia Pte Ltd, Singapore (SG)

(72) Inventors: Afshin Mellati, Aliso Viejo, CA (US); Espen Olsen, Tustin, CA (US); Fazil Ahmad, Irvine, CA (US); Liang Fan, Irvine, CA (US); Quanli Lu, Coto de Caza, CA (US); Pera Florin, Dunrobin (CA); Cindra Abidin, Irvine, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 53 days.

(21) Appl. No.: 18/304,556

(22) Filed: Apr. 21, 2023

Related U.S. Application Data

(60) Provisional application No. 63/334,281, filed on Apr. 25, 2022, provisional application No. 63/333,139, filed on Apr. 21, 2022.

(51) Int. Cl.
*H03M 1/10* (2006.01)
*H03M 1/66* (2006.01)
*H03M 1/68* (2006.01)
*H03M 1/74* (2006.01)

(52) U.S. Cl.
CPC ............ *H03M 1/1023* (2013.01); *H03M 1/66* (2013.01); *H03M 1/662* (2013.01); *H03M 1/68* (2013.01); *H03M 1/747* (2013.01)

(58) Field of Classification Search
CPC ...... H03M 1/1023; H03M 1/66; H03M 1/662; H03M 1/68; H03M 1/747
See application file for complete search history.

(56) References Cited

U.S. PATENT DOCUMENTS 9,954,547 B1    4/2018   Azenkot et al.
10,516,412 B1 * 12/2019  Mehdizad Taleie .. H03M 1/662
2004/0208249 A1 10/2004  Risbo et al.

OTHER PUBLICATIONS

Olieman, E., et al., "An Interleaved full Nyquist high-speed DAC Technique," *IEEE Journal of Solid-State Circuits*, 50(3):1-30 (2015).

\* cited by examiner

*Primary Examiner* — Joseph J Lauture

(57) ABSTRACT

A time-interleaved current-based digital-to-analog converter (current DAC) cell includes first input circuitry configured to receive a digital input signal, a first biasing voltage, a first clock, and a second clock. The first clock and the second clock having a phase offset from one another and having a common period. The current DAC also includes a first gate configured to, responsive to an 'ON' state of the first clock, pass the digital input signal to a second gate, the second gate being configured to, responsive to an 'OFF' state of the second clock, output a first DAC cell activation signal. The current DAC further includes first output circuitry configured to, responsive to the first DAC cell activation signal, output a first analog current signal based on (i) the digital input signal and (ii) the first biasing voltage.

17 Claims, 8 Drawing Sheets

TIME-INTERLEAVED CURRENT-BASED DIGITAL-TO-ANALOG CONVERTER (CURRENT DAC)

CROSS-REFERENCE TO RELATED APPLICATION

This disclosure claims the benefit of commonly-assigned United States Provisional Patent Applications Nos. 63/333,139 and 63/334,281, filed Apr. 21, 2022 and Apr. 25, 2022, respectively, each of which is hereby incorporated by reference herein in its respective entirety.

FIELD OF USE

This disclosure is related generally to time-interleaved, current-based digital-to-analog converters (current DACs) and to adaptive calibration of offset and gain parameters in time-interleaved current DACs.

BACKGROUND

Time-interleaved current-based DAC architectures allow reduced power consumption while enabling higher data link speeds. Multiple DACs operating at a lower speed are time-interleaved so that only one DAC is active at any particular time. However, typical time-interleaved DAC architectures are prone to mismatch-induced errors in at least gain, offset, and timing.

SUMMARY

In accordance with implementations of the subject matter of this disclosure, a time-interleaved current-based digital-to-analog converter (current DAC) cell includes first input circuitry configured to receive a digital input signal, a first biasing voltage, a first clock, and a second clock, the first clock and the second clock having a phase offset from one another and having a common period, a first gate configured to, responsive to an 'ON' state of the first clock, pass the digital input signal to a second gate, the second gate being configured to, responsive to an 'OFF' state of the second clock, output a first DAC cell activation signal, and first output circuitry configured to, responsive to the first DAC cell activation signal, output a first analog current signal based on (i) the digital input signal and (ii) the first biasing voltage.

A first implementation of such a current DAC cell may further include a third gate configured to, responsive to the second clock being in an 'ON' state, pass at least a portion of the analog current signal to a dump output.

A second implementation of such a current DAC cell may further include a third gate configured to, responsive to the second clock being in an 'ON' state, ground the current DAC cell.

A third implementation of such a current DAC cell may further include second input circuitry configured to receive (i) the first biasing voltage, (ii) the first clock, (iii) the second clock, and (iv) a second digital current signal differential to the first digital signal, a third gate configured to, responsive to an 'ON' state of the first clock, pass the second digital input signal to a fourth gate, the fourth gate being configured to, responsive to an 'OFF' state of the second clock, output a second DAC cell activation signal, and second output circuitry configured to, responsive to the second DAC cell activation signal, output a second analog current signal differential to the first analog current signal, based on (i) the second digital input signal and (ii) the first biasing voltage.

In accordance with implementations of the subject matter of this disclosure, a time-interleaved current-based digital-to-analog converter (current DAC) includes initial circuitry configured to receive a digital input signal, and receive a plurality of clock signals having a common period, each one of the plurality of clock signals having a prescribed phase offset from each other one of the plurality of clock signals, a plurality of DAC cells, where each DAC cell of the plurality of DAC cells includes input circuitry configured to receive the digital input signal, a respective biasing voltage, a first clock signal of the plurality of clock signals, and a second clock signal of the plurality of clock signals, a first gate configured to, responsive to an 'ON' state of the first clock signal, pass the respective digital input signal to a second gate, the second gate being configured to, responsive to an 'OFF' state of the second clock signal, activate the respective DAC cell of the plurality of DAC cells, and output circuitry configured to, responsive to a respective DAC cell being activated, generate a respective analog current output signal based on (i) the respective digital input signal and (ii) the respective biasing voltage, and combining circuitry configured to activate adjacent DAC cells of the plurality of DAC cells based on inputs from two adjacent ones of clocks with adjacent phases, where the two adjacent ones of clocks comprise one common clock and two distinct clocks, each adjacent to the one common clock.

In a first implementation of such a time-interleaved current DAC, each DAC cell of the plurality of DAC cells may further include a third gate configured to, responsive to the second clock signal being in an 'ON' state, pass at least a portion of the analog current signal to a dump output.

In a second implementation of such a time-interleaved current DAC, each DAC cell of the plurality of DAC cells may further include a third gate configured to, responsive to the second clock signal being in an 'ON' state, ground each DAC cell.

In a third implementation of such a time-interleaved current DAC, the combining circuitry may be further configured to, when generating a final analog current output signal, combine each respective analog current output signal of each respective DAC cell in the plurality of DAC cells.

In a fourth implementation of such a time-interleaved current DAC, the output circuitry may be further configured to combine respective analog current output signals of adjacent DAC cells with a temporal offset equal to the common period length divided by the number of clocks in the plurality of clocks.

In a fifth implementation of such a time-interleaved current DAC, the plurality of DAC cells may include differential DAC cells, and each differential DAC cell may include first sub-cell circuitry configured to receive a first digital input signal and generate a first analog current output signal, and second sub-cell circuitry configured to receive a second digital input signal, differential to the first digital input signal, and generate a second analog current output signal, differential to the first analog current output signal.

In accordance with implementations of the subject matter of this disclosure, a method for converting a digital input signal to an analog current signal includes receiving, at a first current DAC cell, a first digital input signal, a first biasing voltage, a first clock signal, and a second clock signal, the first clock signal and the second clock signal having a phase offset and having a common period, responsive to an 'ON' state of the first clock signal at a first gate, passing the first digital input signal to a second gate, responsive to an 'OFF' state of the second clock signal at the second gate, outputting a first activation signal, and responsive to the first activation signal, outputting a first analog current output signal dependent on (i) the first digital input signal and (ii) the first biasing voltage.

A first implementation of such a method may further include, responsive to an 'ON' state of one of the first clock and the second clock, passing at least a portion of the analog current signal to a dump output.

A first aspect of that first implementation may further include, responsive to an 'ON' state of one of the first clock and the second clock, grounding the current DAC cell.

A second implementation of such a method may further include receiving, at a second current DAC cell, the digital input signal, the second clock signal, a third clock signal, and a second biasing voltage, responsive to an 'OFF' state of the second clock signal at a third gate, passing the digital input signal to a fourth gate, responsive to an 'OFF' state of the second clock signal at the fourth gate, activating the second current DAC cell, and generating a second analog current signal based on (i) the digital input signal and (ii) the second biasing voltage.

A first aspect of that second implementation may further include generating a final analog signal by combining the first analog signal and the second analog signal.

In a first instance of that first aspect, generating the final analog signal may include combining the first current analog signal and the second current analog signal with a temporal offset equal to the common period divided by the number of clocks in the plurality of clocks.

In a third implementation of such a method, the first current DAC cell may be a differential current DAC cell, and the method may further include receiving, at the differential current DAC cell, (i) the first biasing voltage, (ii) the first clock signal, (iii) the second clock signal, and (iv) a second digital current signal differential to the first digital current signal, responsive to an 'OFF' state of the second clock signal at a third gate, passing the second digital input signal to a fourth gate, responsive to an 'OFF' state of the second clock signal at the fourth gate, activating sub-cell circuitry of the differential current DAC cell, and responsive to the sub-cell circuitry of the differential current DAC cell being activated, outputting a second analog current output signal, differential to the first analog current output signal, based on the second digital current signal and the first biasing voltage.

In accordance with implementations of the subject matter of this disclosure, circuitry for dynamically calibrating a time-interleaved digital-to-analog converter (DAC) includes DAC circuitry configured to receive a digital input signal and generate an output analog signal, DAC modeling circuitry configured to receive the input signal and generate a model analog signal and adjust a digital model based on the model analog signal and the digital input signal, and control circuitry configured to determine at least one of an offset error and a gain error, and generate a DAC error correction signal based on the at least one of an offset error and a gain error.

In a first implementation of such circuitry, the DAC circuitry may include a plurality of DAC cells.

According to a first aspect of the first implementation, the DAC modeling circuitry may include a plurality of model DAC cells, each model DAC cell being configured to model a cell of the plurality of DAC cells.

In a first instance of that first aspect, the control circuitry, when generating an error correction signal, may be configured to generate a correction vector containing a respective correction value for each respective DAC cell in the plurality of DAC cells.

According to a second aspect of the first implementation, the control circuitry may be configured to, when determining the gain error, determine at least one of an aggregate gain error representing a cumulative gain error across the plurality of DACs and a set of individual gain errors representing a gain error for each DAC of the plurality of DACs.

In a second implementation of such circuitry, the control circuitry may be further configured to apply the error correction signal to the digital input signal.

In a third implementation of such circuitry, the control circuitry may be further configured to apply the error correction signal to the output analog signal.

In a fourth implementation of such circuitry, the control circuitry may be configured to, when determining the offset error, generate an error signal representing a least mean square error between the output analog signal and the model analog signal.

In a fifth implementation of such circuitry, the control circuitry may be configured to, when determining the gain error, generate an error signal representing a least mean square error between the output analog signal and the model analog signal.

A sixth implementation of such circuitry may further include an analog-to-digital converter (ADC) configured to feed back an output of the DAC circuitry to an input of the DAC modeling circuitry.

According to a first aspect of that sixth implementation, the DAC modeling circuitry may be further configured to determine a DAC model based on the output fed back by the ADC.

In accordance with implementations of the subject matter of this disclosure, a method for dynamically calibrating a time-interleaved digital-to-analog converter (DAC) includes receiving a digital input signal, generating, from the digital input signal, an output analog signal using DAC circuitry, generating, from the digital input signal, a model analog signal using DAC modeling circuitry, adjusting a digital model based on the model analog signal and the digital input signal, determining at least one of an offset error and a gain error based on comparing the output analog signal to the model analog signal, and generating an error correction signal based on the at least one of an offset error and a gain error.

In a first implementation of such a method, generating the output analog signal using DAC circuitry may include using a plurality of DAC cells to generate a plurality of respective output analog signals.

According to a first aspect of that first implementation, generating the model analog signal using DAC modeling circuitry may include using a plurality of model DAC cells, each respective model DAC cell modeling a respective DAC cell of the plurality of DAC cells.

In a first instance of that first aspect, generating an error correction signal may include generating a correction vector containing a respective correction value for each respective DAC cell in the plurality of DAC cells.

According to a second aspect of that first implementation, determining the gain error may include determining at least one of an aggregate gain error representing a cumulative gain error across the plurality of DACs and a set of individual gain errors representing a gain error for each DAC of the plurality of DACs.

A second implementation of such a method may further include applying the error correction signal to the digital input signal.

A third implementation of such a method may further include applying the error correction signal to the output analog signal.

In a fourth implementation of such a method, generating the error correction signal based on the offset error may include iteratively comparing a test model analog signal to the output analog signal until the test model analog signal represents a least mean square error between the output analog signal and a final model analog signal.

In a fourth implementation of such a method, generating the error correction signal based on the gain error may include iteratively comparing a test model analog signal to the output analog signal until the test model analog signal represents a least mean square error between the output analog signal and a final model analog signal.

A fourth implementation of such a method may further include feeding back, by an ADC, an output of the DAC circuitry to an input of the DAC modeling circuitry.

A first aspect of that fourth implementation may further include determining a DAC model based on the output fed-back by the ADC.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
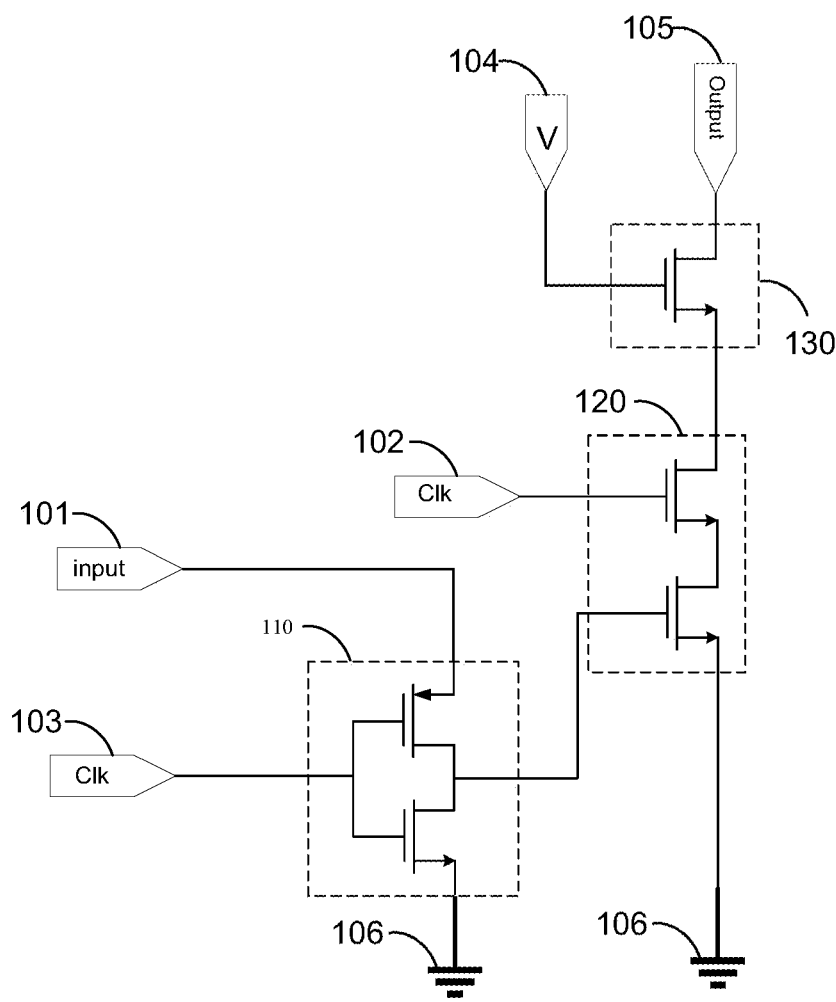
FIG. 1 is a block diagram illustrating the basic structure of a current DAC cell, according to some implementations of the subject matter of this disclosure.

As the growth of network traffic pushes data links to ever-higher rates, digital-to-analog converters (DACs) are required to function at higher frequencies and thus require clocks that consume more power. Time-interleaved DAC architectures can reduce power consumption while achieving faster speeds, with multiple DACs operating at a lower speed, and time-interleaved so that only one DAC is on at any particular time. However, time-interleaved DAC architectures are prone to errors in the gain, offset, timing, bandwidth and distortion. Timing errors may be corrected by generating a digital model of the DAC to calibrate the analog signal. These models may be generated by auto correlation, least-mean-squares (LMS) analysis, finite impulse response (FIR) or infinite impulse response (IIR) filtering, other adaptive filtering techniques, neural-network-based modeling, linear and nonlinear modeling, or any other modeling process.

The ever-increasing quantity of network-connected devices and performance quality of these devices has increased the performance burden of digital-to-analog converter (DAC) cells. In particular, individual DAC cells and greater DAC architectures including a plurality of DAC cells are challenged to operate at increasingly high clock frequencies without requiring excessively large power consumption.

Time interleaving is one approach to improve the operational speed of a DAC. A time-interleaved DAC includes a plurality of DAC units, each of which includes a plurality of DAC cells and is clocked at a given frequency. By sampling each respective unit at the given frequency, the effective sampling frequency of the overall time-interleaved DAC is increased to be equal to the product of the given frequency and the number of DAC units. In this manner, faster device performance can be achieved without having to sample any individual DAC unit at an excessively high frequency.

The process of interleaving individual DAC units may reduce the accuracy of the resulting time-interleaved DAC. This accuracy reduction is mainly attributed to mismatch between DAC cells and units, where the mismatch is with respect to at least one of the cell or unit gain or offset. DAC gain is herein defined as the ratio of an incremental change in output signal magnitude over an incremental change in input signal magnitude. DAC offset is herein defined as a shift between the ideal output signal magnitude and the physically realized output signal magnitude. Gain and offset mismatch is defined as discrepancies in these parameters among individual DAC cells within a plurality of cells or among individual DAC units within a plurality of time-interleaved units. Gain or offset mismatch is particularly impactful to the accuracy of time-interleaved DACs because the interleaving of a plurality of DAC units, each of which typically has a unique gain and offset, introduces challenges in compensating for the resulting plurality of mismatches.

Other challenges exist in achieving high-performance DAC architectures. Input noise reduces DAC accuracy, and reduced sensitivity to input noise can be achieved using a differential DAC cell. A typical differential cell includes two replicated instances of DAC circuitry (i.e., two units of sub-cell circuitry), each of which receives a differential input (i.e., the inputs are equal in magnitude and opposite in polarity) and returns a corresponding differential output (i.e., the outputs are equal in magnitude and opposite in polarity). These differential outputs may subsequently be combined into a "single-ended" output, e.g., through a subtraction operation that yields a single-ended output magnitude which is approximately double the magnitude of each differential output.

Yet another challenge in achieving high-performance DAC architectures is hysteresis—i.e., a prior signal state affecting a current signal state. Hysteresis may reduce the fastest sampling frequency available for a given DAC cell due to requiring more time for charge in the cell to settle to a steady state or requiring more time to allow for resetting in between a prior and a current state.

In accordance with implementations of the subject matter of this disclosure, a device and method for adaptive DAC calibration is disclosed to overcome the abovementioned limitations.

An adaptive DAC cell improves the sampling rate and power consumption over a typical DAC cell. The adaptive DAC cell may be used in single-ended or differential implementations. The adaptive DAC cell includes two clock signals (i.e., "adjacent clocks") with a common period and a prescribed phase offset (i.e., "adjacent phases"). In the initialization state of the DAC cell, a digital input signal is passed to a gate which is inactivated to expedite transmission during the operating state and prevent parasitic current flow. In the subsequent operating state, which corresponds to the length of the adjacent phase offset, the inactivated gate is activated, causing an analog output current signal to flow proportional to the digital input signal. The analog output current signal is further proportional to a bias voltage on the gate. After the operating state of the cell has been engaged for a time equal to the adjacent phase offset, a second gate is activated which decouples the digital input signal to the first gate and opens the analog output current signal path (to prevent additional power consumption). The DAC cell only transmits current during the phase offset period and is otherwise inactive or adaptively calibrated for the remaining duration of the common period.

The adaptive DAC cell is further improved by including "output dump" circuitry. At the conclusion of the operating state of the cell, this dump circuitry shunts at least a portion of the analog output current signal to ground. The shunting, as triggered by a third gate, occurs concurrently with the activation of the second gate, as these two gates are triggered by related clock signals (e.g., the same clock signals or a clock signal and its inverse). Due to a delay between activating the second gate and opening the analog output current signal path, the dump circuitry may discharge the analog output current signal path prior to this path becoming open. Due to discharging the output signal path, the operating state can be made shorter, the initialization state can be made more robust, and power consumption is reduced.

A single adaptive cell (in single-ended or differential implementations) may be replicated into an adaptive DAC unit, which includes a plurality of adaptive cells. When operating such cells, adjacent cells (i.e., cells geometrically contiguous to each other or cells representing contiguous bit values), the adjacent clocks of each cell will include one adjacent clock from each adjacent cell. For example, in a three-cell implementation, the adjacent clocks of the middle cell will include a clock of the first cell (i.e., the second adjacent clock of the first cell) and a clock of the last cell (i.e., the first adjacent clock of the last cell). In this sequentially adjacent implementation, only one cell of a DAC unit is in the operational state at a given time, and the output of each DAC unit cell can be correspondingly combined without error. During the combination operation, the outputs are combined at a rate equal to the length of the common clock period divided by the number of clocks in the plurality of adaptive cells.

A single adaptive DAC unit may be replicated into an adaptive time-interleaved DAC, which includes a plurality of adaptive units. In this implementation, the time-interleaved DAC is made further adaptable by including error correction circuitry to compensate for at least one of gain or offset mismatch. The error correction circuitry includes a plurality of DAC model cells, each of which models a DAC cell. The DAC model cells receive the same input as the DAC cells and apply an error correction technique, such as a learning management system, to model at least one of the gain or offset mismatch in the DAC cells. Upon modeling the mismatch, the error correction circuitry applies an error correction signal to the DAC. The error correction signal may be combined at the DAC input as a digital error correction signal, or it may be combined at the DAC output as an analog error correction signal. To account for cases wherein the mismatch or the precision requirements may be especially high, the error correction circuitry can also receive the DAC output to inform on the optimal error correction technique. This feedback-based error correction may further include an analog-to-digital converter between the DAC cell and the model DAC cell, to properly condition the feedback data and further inform on the optimal error correction technique. In an iterative implementation, the error correction circuitry may repeatedly test different error correction signals until a least mean squared error is recorded.

The subject matter of this disclosure may be better understood by reference to FIGS. 1-8.

A DAC cell 100, according to some implementations of the subject matter of this disclosure, receives input 101 and transmits corresponding output 105 when clock ("Clk") 102 is 'ON' (i.e., a logic '1') and clock 103 is 'OFF' (i.e., a logic '0'). Gates 110, and 120 are logic gates which are configured to control the flow of current based on the logic values of clock 102 and clock 103. In some implementations, each of gate 110 and gate 120 includes two transistors, as shown.

When clock 103 is 'OFF,' gate 110 is activated to transmit input 101 to gate 120. Clock 102 and clock 103 are configured with a phase offset and a common period, such that in each clock cycle, clock 103 turns off after clock 102. When clock 102 turns 'ON' (which, due to the phase offset, occurs while clock 103 is still 'OFF'), gate 120 is turned on and thus allows current flow. The magnitude of this current flow is determined by the voltage-controlled amplifier of gate 130 and the bias voltage 104. Correspondingly, output 105 is transmitted when clock 102 is 'ON' and clock 103 is 'OFF,' representing a unit interval within a single clock cycle during which the DAC cell is active. In some implementations, gate 130 includes one transistor, as shown.

Further details of the operational states of DAC cell 100 may be better understood with respect to the clock phase offset, as mentioned above and as further described below. In these related discussions, given clock signals (i.e., 'HIGH' or 'LOW') are mentioned in correspondence to resulting gate conditions (i.e., 'ON' or 'OFF') in accordance with specific implementations as shown. However, in related implementations not explicitly shown, clock signals may correspond to alternate gate conditions due to reconfiguration of at least one of the clock or the gate, without departing from the spirit of the implementation.

Figure 2:
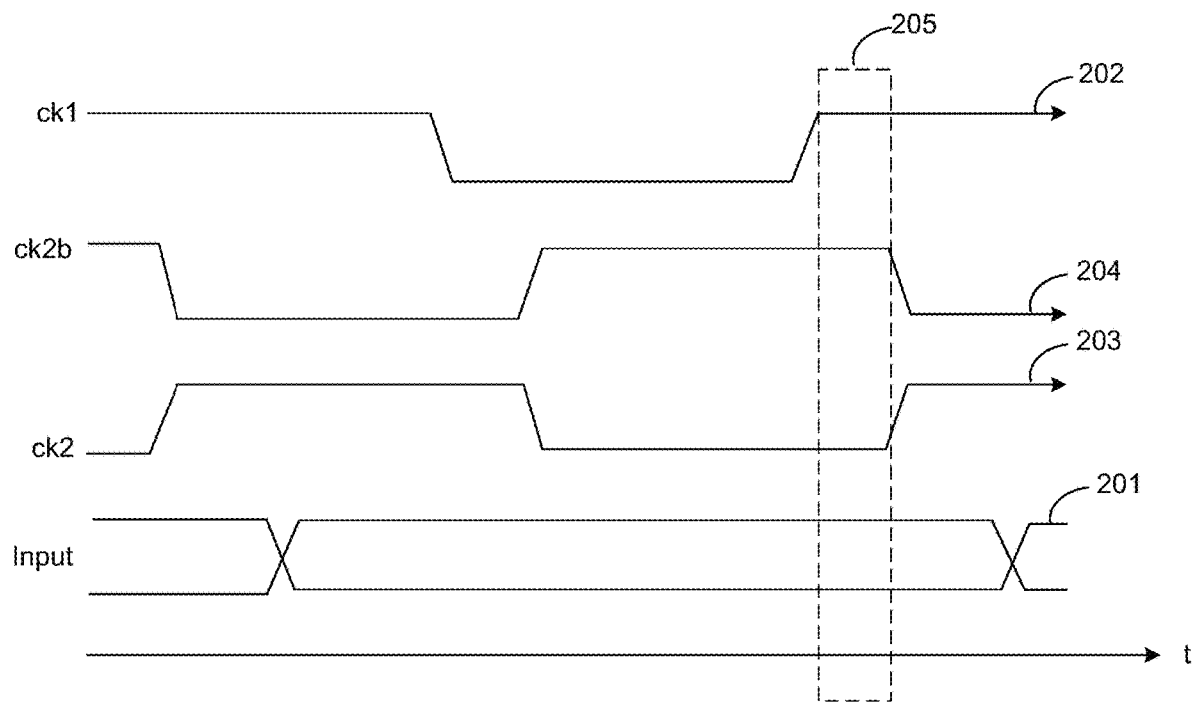
FIG. 2 is a representation of the periods of two clocks in a current DAC cell according to implementations of the subject matter of this disclosure.

FIG. 2 is a diagram of signals 200 to DAC cell 100, according to some implementations of the subject matter of this disclosure. Signals 200 include input 201, first clock ("ck1") 202, second clock ("ck2") 203, and inverse second clock ("ck2b") 204. Input 201 represents input 101, which may correspond to any digital input signal that is converted by DAC cell 100 into a corresponding analog output signal. The ck1 202 signal represents the signal of clock 102, and the ck2 203 signal represents the signal of clock 103; these signals have a phase offset and a common period. The phase offset is denoted an "adjacent" phase offset and a pair of clocks having an "adjacent" phase offset are denoted as "adjacent" clocks. The phase offset is determined by the length of time between a rising edge of ck1 202 and a rising edge of ck2 203, as highlighted by time unit interval 205. Within time unit interval 205, the DAC cell 100 is active due to gate 110 transmitting input 101 to gate 120 (when ck2 203 is 'LOW', i.e., a logic '0') and gate 120 transmitting input 101 to output 105 (when ck1 202 is 'HIGH', i.e., a logic '1'). Prior to unit interval 205, input 101 is held at gate 120 while this gate is 'OFF' (as per ck1 202 being 'LOW'). After unit interval 205, gate 110 is turned 'OFF' (as per ck2 203 being 'HIGH'), and input 101 is shunted to ground 106.

Figure 3:
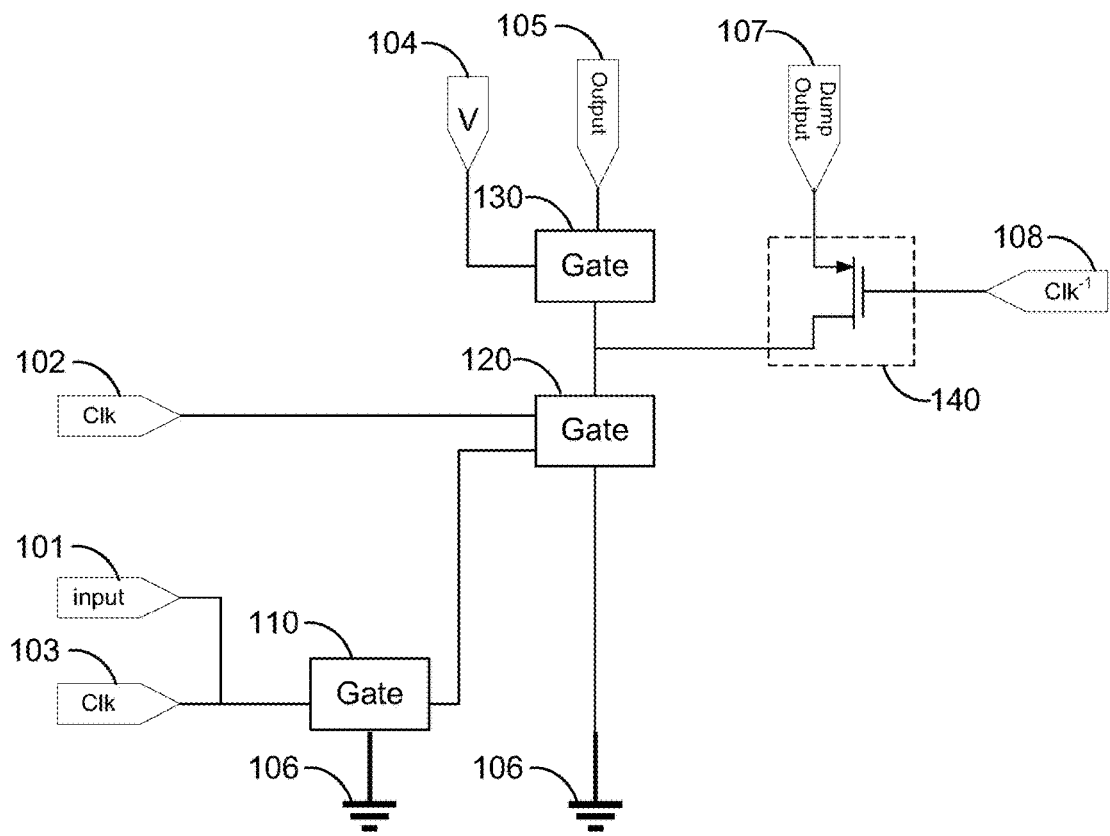
FIG. 3 is a block diagram illustrating the structure of the current DAC cell with additional ground and dump output, according to implementations of the subject matter of this disclosure.

FIG. 3 is a block diagram illustrating the structure of DAC cell 300, according to some implementations of the subject matter of this disclosure. Compared to DAC cell 100, DAC cell 300 also includes dump output 107 and gate 140, and also receives an inverse clock ("clk-1") 108 signal. Inverse clock 108 is represented by the ck2b 204 signal, which is the inverse of ck2 203 (which represents the clock 103 signal). In DAC cell 300, gate 140 turns on when clock 108 is 'LOW' and discharges the signal on gate 120 through transmitting dump output 107 to ground 106. This grounding of the current DAC cell 300 may better prepare the cell for receipt of a subsequent input 101. The additional components in DAC cell 300 improve the speed of DAC cell 100 and reduce its power consumption and internal glitching, due to the dump output 107 reducing the hysteresis and parasitic charge storage of DAC cell 300 compared to DAC cell 100. In some implementations, gate 140 includes one transistor, as shown.

Figure 4:
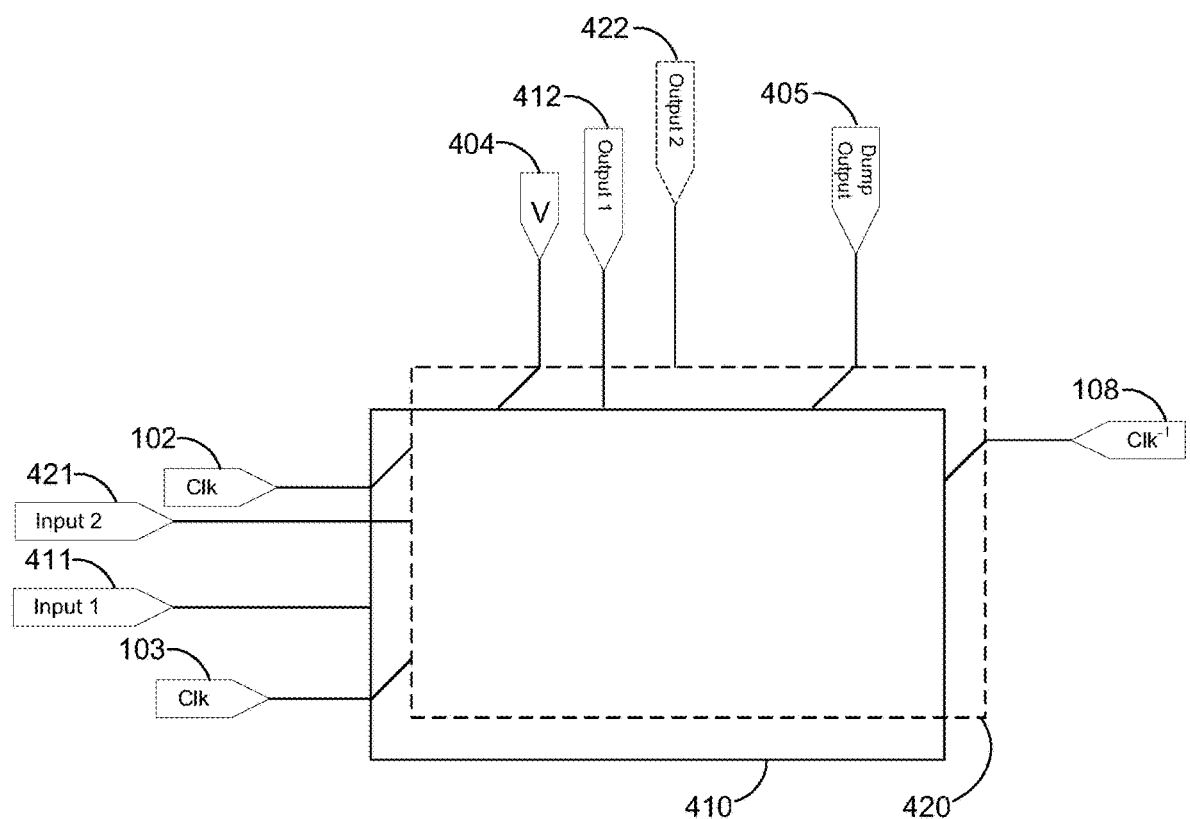
FIG. 4 is a block diagram illustrating the basic structure of a differential current DAC cell, according to implementations of the subject matter of this disclosure

FIG. 4 is a block diagram illustrating the structure of differential DAC cell 400, according to some implementations of the subject matter of this disclosure. Differential DAC cell 400 includes two respective units of DAC sub-cell circuitry 410 and 420, which may correspond to two of either DAC cell 100 or DAC cell 300 when implemented as a differential pair. In the implementation of FIG. 4, including dump output 405, the differential DAC cell 400 receives common clocks 102, 103, and 108 and common bias voltage 404. The common clocks 102, 103, and 108 simultaneously control the operational states of the respective units of DAC sub-cell circuitry 410 and 420, while the common bias voltage 404 controls the voltage-controlled amplification within each of the respective units of DAC sub-cell circuitry 410 and 420.

In the implementation of differential DAC cell 400, input 1 (411) is received by a first unit of the differential pair (i.e., DAC sub-cell circuitry 410), and input 2 (421), which is differential with respect to input 1 (411), is received by a second unit of the differential pair (i.e., DAC sub-cell circuitry 420). Accordingly, output 1 (412) is generated by the first unit of the differential pair and output 2 (422), which is differential with respect to output 1 (412), is generated by the second unit of the differential pair. Considering a pair of input or output signals, a second may be differential with respect to the first when the second has a magnitude equal and a polarity opposite to the first. The differential implementation of DAC cell 400 improve the speed of DAC cells 100 or 300 and reduces the sensitivity to input noise.

Any one of the DAC cell 100, DAC cell 300, and differential DAC cell 400 may be replicated and operated as a DAC based on the plurality of DAC cells. Any such DAC may be replicated and operated in tandem as a time-interleaved DAC. Any such DAC or time-interleaved DAC may be a current DAC (i.e., the output signals are currents) or a voltage DAC (i.e., output signals are voltages). The unit DAC cells within a DAC may be operated in a binary fashion, a thermometer fashion (e.g., the output signal can take one of at least three values, proportional to the input signal), or a combination thereof. The unit DAC cells may receive a common bias voltage or may be uniquely biased to determine a relative weight (e.g., a most- or least-significant bit) of the cell within the greater DAC. The structures of the gates within a given DAC unit cell may be tuned according to a unique bias voltage, operational implementation, or DAC architecture to realize a DAC with suitable speed, resolution, and power consumption.

In the implementation of a DAC with a plurality of DAC cells, each of the DAC cells receives coordinated clock signals from a plurality of clock signals, as is henceforth explained. A second unit DAC cell, adjacent to a first unit DAC cell receiving a first and second clock signal, receives the second clock signal and a third clock signal. The phase of the third clock is offset with respect to the second in a manner that is functionally equal to the phase offset of the second with respect to the first. Accordingly, each pair of clock signals (e.g., first-and-second, second-and-third, or other "adjacent clocks") has an "adjacent" phase offset (or "adjacent phases") and a common period. For a given number of clocks in the plurality of clocks, the "adjacent phase" offset may correspond to the temporal length of the common period divided by the number of clocks. This scheme of adjacent unit cells sharing one of the two "adjacent clock" signals, which is offset from the other of the two clock signals by an "adjacent phase," is propagated across the entire plurality of unit DAC cells composing a DAC. At the last two unit cells of the plurality of cells, the clock signal of the last cell which is not common to the second-to-last cell may correspond to the first clock of the first cell. Stated differently for a three-cell example, the fourth clock (i.e., which is received by the third cell and not common to the second cell) may correspond to the first clock (i.e., which is received by the first cell and not common to the second cell).

In a time-interleaved DAC implementation, the adjacent clocks and phases must be accounted for when combining the outputs of respective DAC units into a time-interleaved final output signal. In this case, additional output circuitry is included to combine respective DAC output signals into a final time-interleaved DAC output signal with a temporal offset equal to the common period length divided by the number of clocks in the plurality of clocks. As a result, each respective output signal is added to the final output signal only after each respective DAC cell has fully processed its respective signal.

Figure 5:
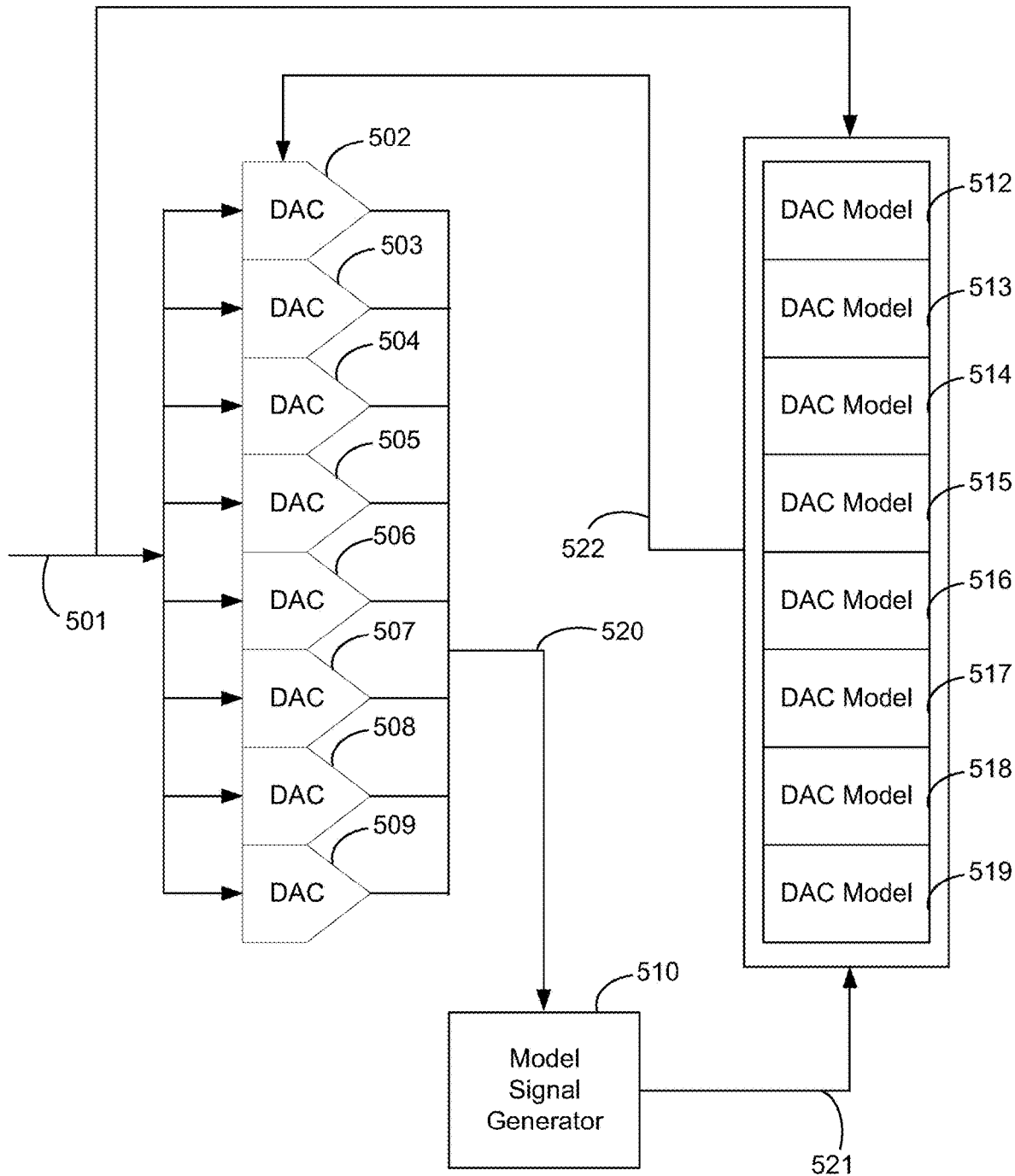
FIG. 5 is a block diagram illustrating a current DAC with eight DAC cells and DAC models for dynamic calibration, according to implementations of the subject matter of this disclosure.

FIG. 5 is a block diagram illustrating an adaptively calibrated DAC 500, according to some implementations of the subject matter of this disclosure. Included in FIG. 5 is a plurality of DAC cells 502 through 509 and a plurality of model DAC cells 512 to 519. Each of the model DAC cells 512 to 519 models one of the plurality of DAC cells 502 through 509. Each of the DAC cells may be DAC cell 100, DAC cell 300, differential DAC cell 400, or functionally similar circuitry. Due to process, voltage, or temperature variation, or device aging, each cell of the plurality of DAC cells 502 through 509 may exhibit a unique mismatch with respect to the other cells. This mismatch may include a gain mismatch, an offset mismatch, or both. The entire DAC may also exhibit an aggregate gain mismatch, which represents a cumulative gain mismatch across a plurality of DAC cells according to the respective gain mismatches of each cell. Considering DAC cell 500, the aggregate gain may be mismatched with respect to replications of DAC cell 500 during coordinated operation of all of these DAC cells— e.g., in a time-interleaved manner. The existence of these errors reduces the resolution and speed of a (single or time-interleaved) DAC. Any one or more of these mismatches may be corrected on a unit cell basis, a single-DAC basis, or a multi-DAC basis in a time-interleaved implementation including several DACs.

In the implementation of the actively calibrated DAC 500, input signal 501 is a digital signal that is received by the plurality of DAC cells 502 through 509. The DAC cells generate an output signal 520 that is received by a model signal generator 510. The model signal generator 510 generates a model signal 521 that is received by the plurality of model DAC cells 512 to 519, which further receive the input signal 501. The parameters of the plurality of model DAC cells 512 through 519 may be adjusted based on the model signal and the digital input signal. Accordingly, the model DAC cells 512 to 519 determine at least one of an offset error and a gain error for each DAC cell and estimate an aggregate gain error for the entire DAC cells 502 through 509. Based on at least one of the errors and a corresponding error correction technique, feedback signal 522 is generated and fed back to the plurality of DAC cells 512 through 519 to correct for at least one the errors. Depending on the implemented feedback technique, the feedback signal 522 may be a digital or an analog signal. Due to receiving the error-correcting feedback signal 522, the accuracy of analog DAC output signal 520 is improved. DAC 500 may iteratively adjust the applied error correction technique until the accuracy of DAC output signal 520 represents a least mean square error (LMSE). It may be determined that DAC output signal 521 represents the LMSE based on a subsequent evaluation in which both results of a two-sided modification of the error-correcting feedback signal 522 (e.g., increasing and reducing the feedback signal magnitude) increase the corresponding error value of DAC output signal 520. The error-correcting feedback signal 522 may be fed back to the DAC input signal 501 (e.g., as a digital correction signal) or the DAC output signal 520 (e.g., as an analog correction signal), and may be incorporated into either of those signals through a sum or multiply operation.

In some implementations, error-correcting feedback signal 522 may be an error vector containing a correction value for each DAC cell of the DAC and each correction value may be applied to each DAC cell. In some implementations, error-correcting feedback signal 522 may be multiple error vectors with each error vector corresponding to a different error to be corrected. For example, a first error vector may contain correction values correcting for the offset error for each DAC cell in the DAC while a second vector may contain correction values correcting for the gain error for each DAC cell in the DAC. In these implementations, both vectors may be fed back to the DAC input signal 501 (e.g., as a digital correction signal) or the DAC output signal 520 (e.g., as an analog correction signal), or one vector may be fed back to the DAC input signal 501 (e.g., as a digital correction signal) while the other is fed back to the DAC output signal 520 (e.g., as an analog correction signal).

In some implementations, an analog-to-digital converter (ADC) may be included in model signal generator 510 to receive the output signal 520 of the plurality of DAC cells 502 through 509. This ADC enables model signal generator 510 to transmit analog DAC output signal 520 as a digital input to the plurality of model DAC cells 512 through 519. In some other implementations, the output of the feedback signal from the ADC may determine the models that are applied to the plurality of model DAC cells 512 through 519.

Figure 6:
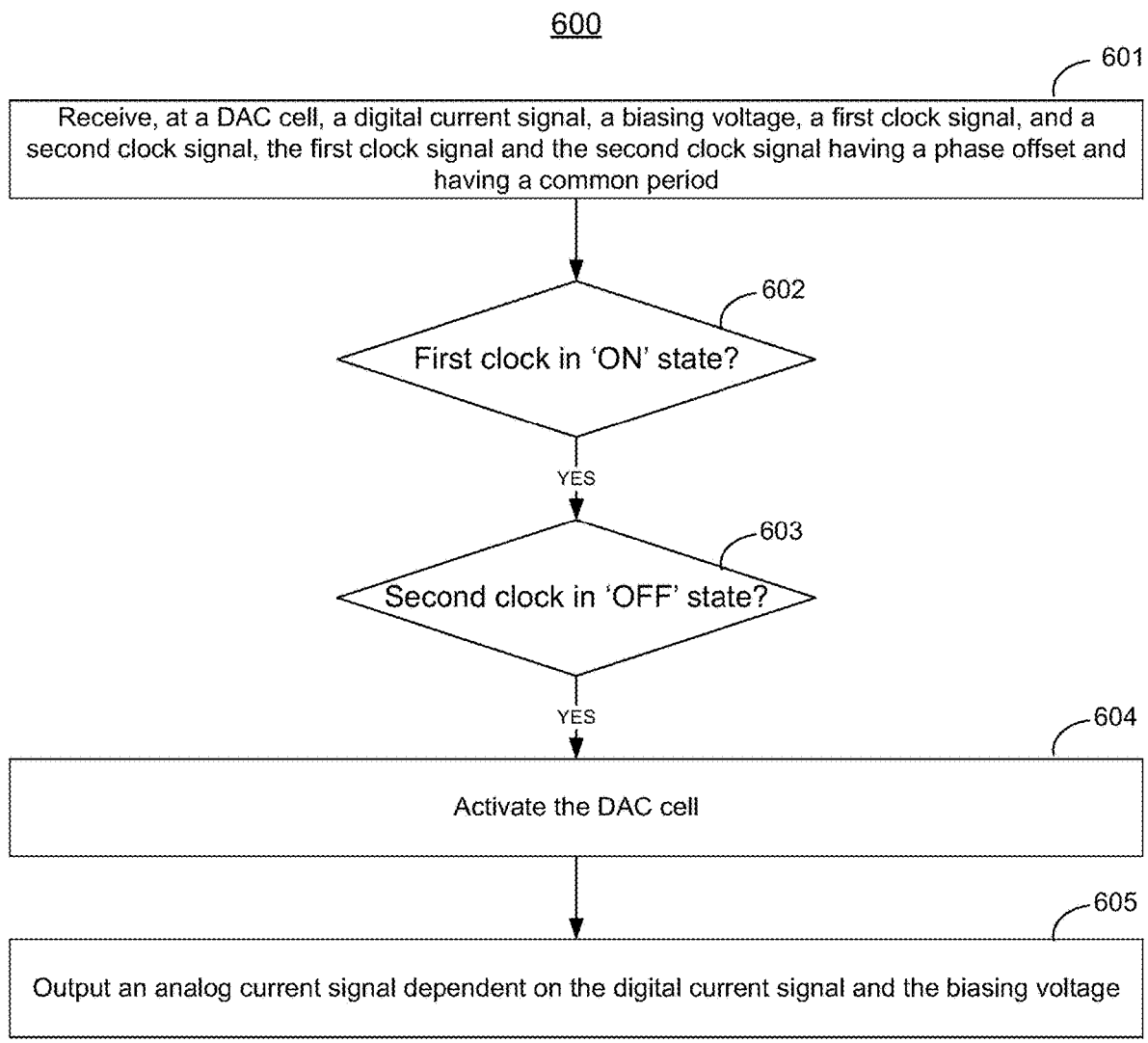
FIG. 6 is a flow diagram illustrating a method of operation of a DAC cell according to implementations of the subject matter of this disclosure.

A method of operation of a DAC cell according to some implementations of the subject matter of this disclosure is diagrammed in FIG. 6.

At 601, a digital input signal, a biasing voltage, a first clock signal, and a second clock signal are received at a DAC cell. The first clock and the second clock have a phase offset and a common period.

At 602, the DAC cell determines if the first clock is in an 'ON' state. If it is, the method continues to step 603. If the first clock is in an 'OFF' state, the DAC cell will hold the digital input signal until the first clock switches to an 'ON' state. At 603, the DAC cell determines if the second clock is in an 'OFF' state. If it is, the method continues to step 604. If the second clock is in an 'ON' state, the DAC cell will stop transmitting an analog current signal corresponding to the digital input signal.

At 604, in response to the first clock being in an 'ON' state and the second clock being in an 'OFF' state, the DAC cell is activated. At 605, the DAC cell outputs an analog current signal dependent on the digital input signal and the biasing voltage.

Figure 7:
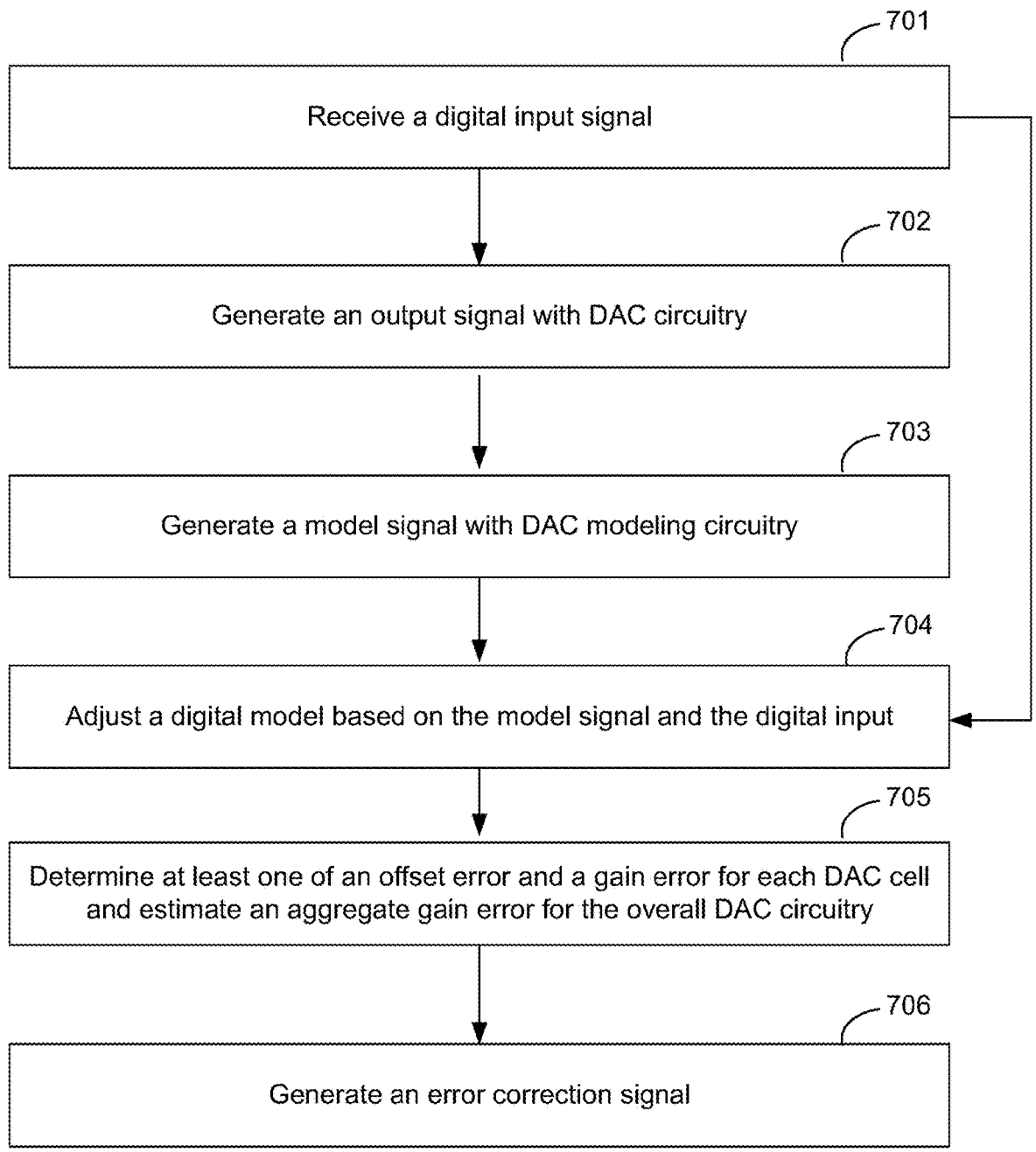
FIG. 7 is a flow diagram illustrating a DAC calibration method according to implementations of the subject matter of this disclosure.

FIG. 7 is a flow diagram illustrating the DAC calibration method according to some implementations of the subject matter of this disclosure. At 701, a digital signal is received. At 702, DAC circuitry generates an output signal from the digital signal. At 703, DAC modeling circuitry generates a model signal from the digital signal.

At 704, a digital model is adjusted based on the model signal and digital input. At 705, at least one of an offset error and a gain error is determined. The gain error is determined for each DAC cell in the DAC circuitry. Additionally, an aggregate gain error is estimated for the overall DAC circuitry. At 706, an error correction signal is generated.

Figure 8:
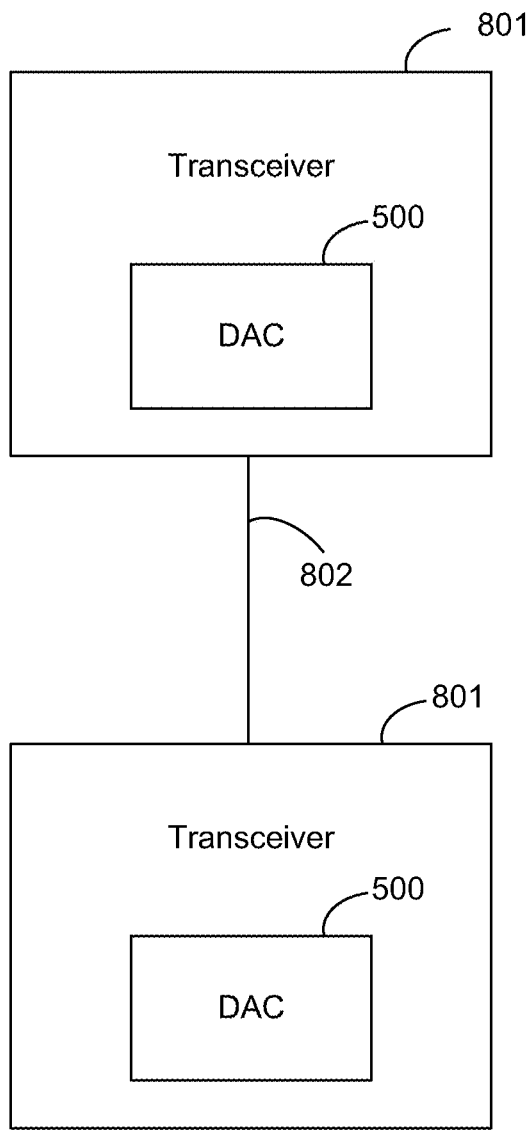
FIG. 8 is a block diagram of a communications system including transceivers incorporating DAC circuitry according to implementations of the subject matter of this disclosure.

As shown in FIG. 8, DAC circuitry according to implementations of the subject matter of this disclosure may be included in transceivers of a communications system, such as Ethernet physical layer transceivers (PHYs). In the implementation of FIG. 8, two transceiver devices 801 (which may be Ethernet PHYs) communicate via two-way data link 802. Within each transceiver device 801 is DAC circuitry 500. For a given transceiver device 801 operating in the transmission state, DAC circuitry 500 may convert a processed input signal (e.g., fed to the transceiver 801 by an operator) into an analog output current that is transmitted across two-way data link 802. For a given transceiver device 801 operating in the receiving state, DAC circuitry 500 may convert a processed input signal (e.g., fed to the transceiver 801 by two-way data link 802) into an analog output current that is provided to functional circuitry (not shown).

Thus it is seen that time-interleaved, current-based digital-to-analog converters, and adaptive calibration of offset and gain parameters in time-interleaved digital-to-analog converters, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A time-interleaved current-based digital-to-analog converter (current DAC) cell, comprising:
    first input circuitry configured to receive a first digital input signal, a first biasing voltage, a first clock, and a second clock, the first clock and the second clock having a phase offset from one another and having a common period;

a first gate configured to, responsive to an 'ON' state of the first clock, pass the first digital input signal to a second gate, the second gate being configured to, responsive to an 'OFF' state of the second clock, output a first DAC cell activation signal; and first output circuitry configured to, responsive to the first DAC cell activation signal, output a first analog current signal based on (i) the first digital input signal and (ii) the first biasing voltage.

2. The current DAC cell of claim 1 further comprising a third gate configured to, responsive to the second clock being in an 'ON' state, pass at least a portion of the first analog current signal to a dump output.

3. The current DAC cell of claim 1 further comprising a third gate configured to, responsive to the second clock being in an 'ON' state, ground the current DAC cell.

4. The current DAC cell of claim 1, further comprising:
second input circuitry configured to receive (i) the first biasing voltage, (ii) the first clock, (iii) the second clock, and (iv) a second digital input signal differential to the first digital input signal;
a third gate configured to, responsive to an 'ON' state of the first clock, pass the second digital input signal to a fourth gate, the fourth gate being configured to, responsive to an 'OFF' state of the second clock, output a second DAC cell activation signal; and
second output circuitry configured to, responsive to the second DAC cell activation signal, output a second analog current signal differential to the first analog current signal, based on (i) the second digital input signal and (ii) the first biasing voltage.

5. A time-interleaved current-based digital-to-analog converter (current DAC) comprising:
initial circuitry configured to:
receive a first digital input signal, and
receive a plurality of clock signals having a common period, each one of the plurality of clock signals having a prescribed phase offset from each other one of the plurality of clock signals;
a plurality of DAC cells, wherein each DAC cell of the plurality of DAC cells comprises:
input circuitry configured to receive the first digital input signal, a respective biasing voltage, a first clock signal of the plurality of clock signals, and a second clock signal of the plurality of clock signals,
a first gate configured to, responsive to an 'ON' state of the first clock signal, pass the first digital input signal to a second gate, the second gate being configured to, responsive to an 'OFF' state of the second clock signal, activate the respective DAC cell of the plurality of DAC cells, and
output circuitry configured to, responsive to a respective DAC cell being activated, generate a respective analog current output signal based on (i) the first digital input signal and (ii) the respective biasing voltage; and
combining circuitry configured to activate adjacent DAC cells of the plurality of DAC cells based on inputs from two adjacent ones of clocks with adjacent phases, wherein the two adjacent ones of clocks comprise one common clock and two distinct clocks, each adjacent to the one common 30 clock.

6. The current DAC of claim 5, wherein each DAC cell of the plurality of DAC cells further comprises a third gate configured to, responsive to the second clock signal being in an 'ON' state, pass at least a portion of the respective analog current output signal to a dump output.

7. The current DAC of claim 5, wherein each DAC cell of the plurality of DAC cells further comprises a third gate configured to, responsive to the second clock signal being in an 'ON' state, ground each DAC cell.

8. The current DAC of claim 5, wherein the combining circuitry is further configured to, when generating a final analog current output signal, combine each respective analog current output signal of each respective DAC cell in the plurality of DAC cells.

9. The current DAC of claim 5, wherein the output circuitry is further configured to combine respective analog current output signals of adjacent DAC cells with a temporal offset equal to a length of the common period divided by a number of clocks.

10. The current DAC of claim 5, wherein the plurality of DAC cells comprises differential DAC cells, each differential DAC cell comprising:
first sub-cell circuitry configured to receive a first digital input signal and generate a first analog current output signal; and
second sub-cell circuitry configured to receive a second digital input signal, differential to the first digital input signal, and generate a second analog current output signal, differential to the first analog current output signal.

11. A method for converting a first digital input signal to an analog current signal, the method comprising:
receiving, at a first current DAC cell, the first digital input signal, a first biasing voltage, a first clock signal, and a second clock signal, the first clock signal and the second clock signal having a phase offset and having a common period;
responsive to an 'ON' state of the first clock signal at a first gate, passing the first digital input signal to a second gate;
responsive to an 'OFF' state of the second clock signal at the second gate, activating the first current DAC cell; and
responsive to the first current DAC cell being activated, outputting a first analog current output signal dependent on (i) the first digital input signal and (ii) the first biasing voltage.

12. The method of claim 11 further comprising:
responsive to an 'ON' state of one of a first clock and a second clock, passing at least a portion of the analog current signal to a dump output.

13. The method of claim 12, further comprising:
responsive to an 'ON' state of one of the first clock and the second clock, grounding the first current DAC cell.

14. The method of claim 11, further comprising:
receiving, at a second current DAC cell, the first digital input signal, the second clock signal, a third clock signal, and a second biasing voltage;
responsive to an 'OFF' state of the second clock signal at a third gate, passing the digital input signal to a fourth gate;
responsive to an 'OFF' state of the second clock signal at the fourth gate, activating the second current DAC cell; and
generating a second analog current output signal based on (i) the first digital input signal and (ii) the second biasing voltage.

15. The method of claim 14, further comprising:
generating a final analog signal by combining the first current analog output signal and the second current analog output signal.

16. The method of claim 15, wherein generating the final analog signal comprises combining the first current analog output signal and the second current analog output signal with a temporal offset equal to the common period divided by a number of clocks.

17. The method of claim 11, wherein the first current DAC cell is a differential current DAC cell, the method further comprising:
- receiving, at the differential current DAC cell, (i) the first biasing voltage, (ii) the first clock signal, (iii) the second clock signal, and (iv) a second digital input signal differential to the first digital input signal;
- responsive to an 'OFF' state of the second clock signal at a third gate, passing the second digital input signal to a fourth gate;
- responsive to an 'OFF' state of the second clock signal at the fourth gate, activating sub-cell circuitry of the differential current DAC cell; and
- responsive to the sub-cell circuitry of the differential current DAC cell being activated, outputting a second analog current output signal, differential to the first analog current output signal, based on (i) the second digital input signal and (ii) the first biasing voltage.

\* \* \* \* \*